United States Patent
Quaglietta et al.

(10) Patent No.: US 10,284,153 B2
(45) Date of Patent: May 7, 2019

(54) PEAK VOLTAGE LIMITING CIRCUITS AND METHODS FOR POWER AMPLIFIERS

(71) Applicant: SKYWORKS SOLUTIONS, INC., Woburn, MA (US)

(72) Inventors: Anthony Francis Quaglietta, Methuen, MA (US); Joseph A Cuggino, Westford, MA (US); Xuanang Zhu, Lexington, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/871,952

(22) Filed: Sep. 30, 2015

(65) Prior Publication Data
US 2016/0099688 A1  Apr. 7, 2016

Related U.S. Application Data

(60) Provisional application No. 62/059,839, filed on Oct. 3, 2014.

(51) Int. Cl.
| | |
|---|---|
| *H03F 3/04* | (2006.01) |
| *H03F 1/52* | (2006.01) |
| *H03F 3/19* | (2006.01) |
| *H03F 1/02* | (2006.01) |
| *H03F 3/195* | (2006.01) |
| *H03F 3/24* | (2006.01) |

(52) U.S. Cl.
CPC ............ *H03F 1/52* (2013.01); *H03F 1/0272* (2013.01); *H03F 3/19* (2013.01); *H03F 3/195* (2013.01); *H03F 3/245* (2013.01); *H03F 2200/18* (2013.01); *H03F 2200/408* (2013.01); *H03F 2200/435* (2013.01); *H03F 2200/444* (2013.01); *H03F 2200/451* (2013.01)

(58) Field of Classification Search
CPC ........................................................ H03F 1/52
USPC ...................... 330/296, 298, 285, 207 P, 302
See application file for complete search history.

(56) References Cited

U.S. PATENT DOCUMENTS

| | | | | |
|---|---|---|---|---|
| 6,720,831 B2* | 4/2004 | Dening | ..................... | H03F 3/19 330/207 P |
| 6,990,323 B2* | 1/2006 | Prikhodko | .............. | H03F 1/302 330/285 |
| 7,145,397 B2* | 12/2006 | Yamamoto | ................ | H03F 1/52 330/298 |
| 7,408,412 B2* | 8/2008 | Yamamoto | .............. | H03F 1/302 330/285 |

* cited by examiner

*Primary Examiner* — Khanh V Nguyen
*Assistant Examiner* — Khiem D Nguyen
(74) *Attorney, Agent, or Firm* — Chang & Hale LLP

(57) ABSTRACT

Peak voltage limiting circuits and method for power amplifiers. A power amplifier and/or a voltage limiting circuit includes a diode circuit coupled to an output of an amplification stage, the diode circuit configured to provide a conductive path from the output when an output voltage exceeds a selected value. The power amplifier and/or voltage limiting circuit also includes a sink circuit coupled to the diode circuit and a bias circuit, the sink circuit configured to reduce a bias voltage provided by the bias circuit when the output voltage exceeds the selected value to thereby limit the output voltage.

19 Claims, 13 Drawing Sheets

PEAK VOLTAGE LIMITING CIRCUITS AND METHODS FOR POWER AMPLIFIERS

CROSS-REFERENCE TO RELATED APPLICATION(S)

This application also claims priority to U.S. Provisional Patent Application No. 62/059,839 filed Oct. 3, 2014, entitled PEAK VOLTAGE LIMITING CIRCUITS AND METHODS FOR POWER AMPLIFIERS. The contents of each of the above-referenced application(s) are hereby expressly incorporated by reference herein in their entireties for all purposes.

BACKGROUND

Field

The present disclosure generally relates to power amplifiers (PAs) for radio-frequency (RF) applications.

Description of Related Art

In radio-frequency (RF) applications, an RF signal to be transmitted is typically generated by a transceiver. Such an RF signal can then be amplified by a power amplifier (PA), and the amplified RF signal can be routed to an antenna for transmission.

SUMMARY

In some implementations, the present disclosure relates to a voltage limiting circuit for a power amplifier (PA). The voltage limiting circuit includes a diode circuit coupled to an output of an amplification stage, the diode circuit configured to provide a conductive path from the output when an output voltage exceeds a selected value. The voltage limiting circuit also includes a sink circuit coupled to the diode circuit and a bias circuit, the sink circuit configured to reduce a bias voltage provided by the bias circuit when the output voltage exceeds the selected value to thereby limit the output voltage.

In some embodiments, the amplification stage is an output stage of an amplification path having a plurality of stages.

In some embodiments, the amplification stage includes an amplifying transistor having a base, a collector, and an emitter, such that the output of the amplification stage is at the collector of the amplifying transistor.

In some embodiments, the bias circuit is configured to provide the bias voltage to the base of the amplifying transistor.

In some embodiments, the bias circuit is configured to provide the bias voltage to a base of another amplifying transistor associated with a different amplification stage.

In some embodiments, the different amplification stage is a driver stage.

In some embodiments, the different amplification stage is an amplification stage immediately preceding the output stage.

In some embodiments, the diode circuit includes N diodes connected in series, the quantity N being a positive integer.

In some embodiments, the quantity N is selected to obtain the selected value of the output voltage.

In some embodiments, the diode circuit further includes a resistance in series with the N diodes.

In some embodiments, the sink circuit includes a sink transistor having a base coupled to an end of the N diodes such that when the N diodes become conductive, the sink transistor is turned ON.

In some embodiments, an emitter of the sink transistor is coupled to ground, and a collector of the sink transistor is coupled to a node associated with a reference current of the bias circuit, such that when the sink transistor is ON, at least some of the reference current is diverted to the ground through the sink transistor.

In some embodiments, the bias circuit includes an emitter follower transistor having a base, a collector, and an emitter, such that reference base current is provided to the base by the emitter follower, and a supply voltage is provided to the collector.

In some embodiments, the collector of the sink transistor is coupled to the base of the emitter follower transistor to thereby divide the reference current before it enters the emitter follower transistor.

In some embodiments, the collector of the sink transistor is coupled to the emitter of the emitter follower transistor to thereby divide the base current provided by the emitter follower transistor.

In some embodiments, the amplifying transistor includes a bipolar junction transistor (BJT).

In some embodiments, the BJT is configured as an NPN transistor.

In some embodiments, the BJT is a SiGe transistor or a GaAs transistor.

In some implementations, the present disclosure relates to a method for operating a power amplifier (PA). The method includes detecting a condition where an output voltage of an amplification stage exceeds a selected value. The method also includes providing a conductive path from an output of the amplification stage upon detecting of the condition. The method further includes activating a sink circuit coupled to the conductive path to reduce a bias voltage provided by a bias circuit.

In some implementations, the present disclosure relates to a power amplifier (PA). The power amplifier includes an input port configured to receive an input radio-frequency (RF) signal and an output port configured to yield an amplified RF signal. The power amplifier also includes one or more amplification stages implemented between the input port and the output port, the one or more amplification stages configured to amplify the input RF signal to yield the amplified RF signal. The power amplifier further includes a bias circuit for each of the one or more amplification stages. The power amplifier further includes a ruggedness protection circuit including a diode circuit coupled to an output of a selected one of the one or more amplification stages, the diode circuit configured to provide a conductive path from the output when an output voltage exceeds a selected value, the ruggedness protection circuit further including a sink circuit coupled to the diode circuit and a selected bias circuit, the sink circuit configured to reduce a bias voltage provided by the selected bias circuit when the output voltage exceeds the selected value to thereby limit the output voltage.

In some embodiments, the one or more amplification stages includes a driver stage and an output stage.

In some embodiments, the selected amplification stage is the output stage.

In some embodiments, the selected bias circuit corresponds to the output stage.

In some embodiments, the selected bias circuit corresponds to the driver stage.

In some embodiments, the ruggedness protection circuit is configured to limit the output voltage to reduce likelihood of damage to the output stage without significantly reducing performance of the PA.

In some embodiments, the performance of the PA includes power added efficiency (PAE).

In some embodiments, each of the driver stage and the output stage includes a supply circuit configured to provide a supply voltage to the amplification stage.

In some implementations, the present disclosure relates to a radio-frequency (RF) module. The RF module includes a packaging substrate configured to receive a plurality of components. The RF module also includes a power amplifier (PA) implemented on a die that is mounted on the packaging substrate, the PA including one or more amplification stages configured to amplify an RF signal, the PA further including a bias circuit for each of the one or more amplification stages, the PA further including a ruggedness protection circuit having a diode circuit coupled to an output of a selected one of the one or more amplification stages, the diode circuit configured to provide a conductive path from the output when an output voltage exceeds a selected value, the ruggedness protection circuit further including a sink circuit coupled to the diode circuit and a selected bias circuit, the sink circuit configured to reduce a bias voltage provided by the selected bias circuit when the output voltage exceeds the selected value to thereby limit the output voltage.

In some implementations, the present disclosure relates to a wireless device. The wireless device includes a transceiver configured to generate a radio-frequency (RF) signal. The wireless device also includes an RF module in communication with the transceiver, the RF module including a power amplifier (PA), the PA including one or more amplification stages configured to amplify the RF signal, the PA further including a bias circuit for each of the one or more amplification stages, the PA further including a ruggedness protection circuit having a diode circuit coupled to an output of a selected one of the one or more amplification stages, the diode circuit configured to provide a conductive path from the output when an output voltage exceeds a selected value, the ruggedness protection circuit further including a sink circuit coupled to the diode circuit and a selected bias circuit, the sink circuit configured to reduce a bias voltage provided by the selected bias circuit when the output voltage exceeds the selected value to thereby limit the output voltage. The wireless device further includes an antenna in communication with the RF module, the antenna configured to facilitate transmission of the amplified RF signal.

DETAILED DESCRIPTION OF SOME EMBODIMENTS

The headings provided herein, if any, are for convenience only and do not necessarily affect the scope or meaning of the claimed invention.

In some radio-frequency (RF) applications, amplifiers such as power amplifiers (PAs) are typically designed to function under normal operating conditions, and also survive under at least some abnormal conditions. Such survivability under abnormal operating conditions is typically referred to as ruggedness of the amplifier.

In many RF applications, survivability of amplifiers with voltage standing wave ratio (VSWR) of up to 10:1 and over temperature range extremes is typically expected. Amplifiers can be destroyed or damaged when producing large RF voltage swings. Such voltage swings can be maximized or enhanced at certain load phases and elevated VSWR conditions, as well as presence of a high level of input incident RF power level. Voltage maxima or peak produced under such extreme conditions can induce an avalanche current due to, for example, collector-base voltage (Vcb) breakdown in NPN devices. With such a breakdown, a device can be destroyed or suffer from non-recoverable damage.

In some situations, ruggedness of an amplifier can be an issue when the amplifier is operated outside of its intended range. For example, an amplifier can be designed to operate at a supply voltage (Vcc) of 3.6V, with possible operation at a maximum design limit of 4.6V. When such an amplifier is operated at 5V, its survival can be marginal even at room temperature. For example, such an amplifier can fail at room temperature from input power (Pin) range of −5 dBm to +5 dBm for VSWR of 6:1. It is noted that such failures typically occur at a phase closer to voltage peaking rather than current peaking.

In some implementations, the present disclosure relates to a peak voltage limiting (PVL) circuit that can be implemented in an amplifier such as a power amplifier (PA). Although various examples are described in the context of PAs, it will be understood that one or more features of the present disclosure can also be implemented in other types of RF amplifiers.

Figure 1:
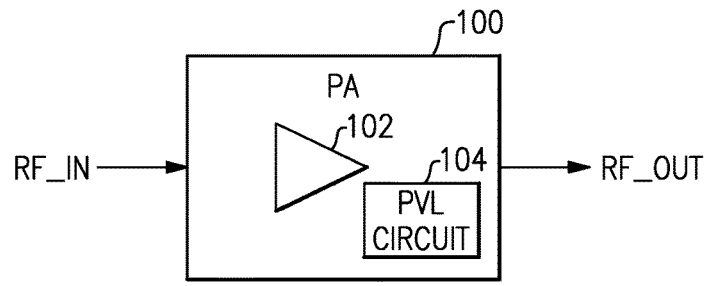
FIG. 1 depicts a power amplifier (PA) having one or more amplification stages configured to receive an input signal and amplify it to generate an amplified signal, according to one embodiment of the present disclosure.

FIG. 1 depicts a power amplifier (PA) 100 having one or more amplification stages 102 configured to receive an input signal (RF_IN) and amplify it to generate an amplified signal (RF_OUT), according to one embodiment of the present disclosure. Such a PA can include and/or be functionally coupled with a peak voltage limiting (PVL) circuit 104. Examples of such a PVL circuit are described herein in greater detail.

In some embodiments, and as described herein, a PVL circuit can be implemented as a closed loop system configured to a respond to a peak voltage condition at the output of an amplifier stage (e.g., output stage) to reduce the bias provided to that amplifier stage (e.g., output stage) to another stage (e.g., driver stage). With such a closed loop system, the gain of the output stage amplification can be adjusted to, for example, reduce the obtainable maximum voltage and thereby avoid damage to the output stage. As described herein, such a closed loop system can be configured to provide improved ruggedness functionality while having minimal or no effect on normal operating characteristics of the amplifier. In the context of bipolar junction transistors (BJTs), the foregoing reduced bias can be a reduced base current. Although some examples are described herein in the context of such BJTs, it will be understood that one or more features of the present disclosure can also be implemented in other types of amplifying transistors.

In some embodiments, one or more features of the present disclosure can be implemented in PAs utilizing a number of process technologies. For example, PAs based on silicon germanium (SiGe), gallium arsenide (GaAs), silicon-on-insulator (SOI), or any other semiconductor process can benefit from one or more features as described herein.

Figure 2A:
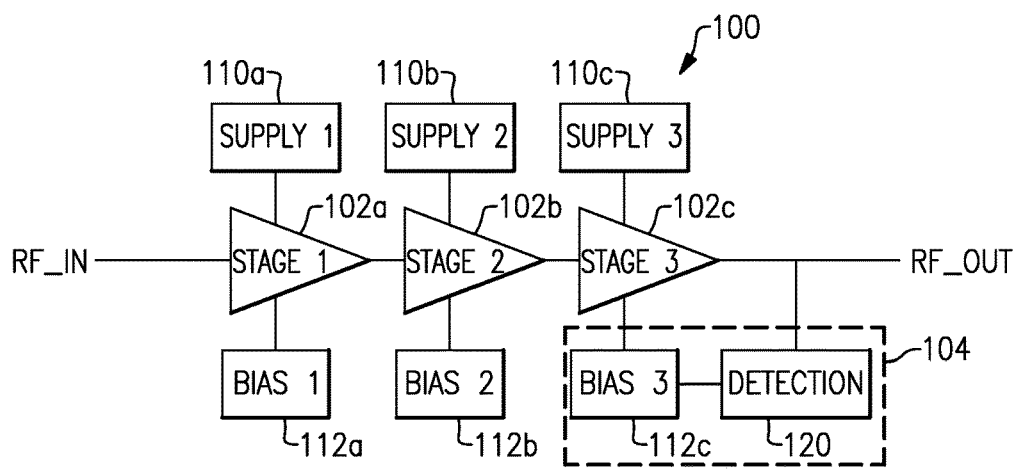
FIGS. 2A and 2B show examples of a peak voltage limiting (PVL) circuit implemented for a PA system having three amplification stages, according to one embodiment of the present disclosure.
Figure 2B:
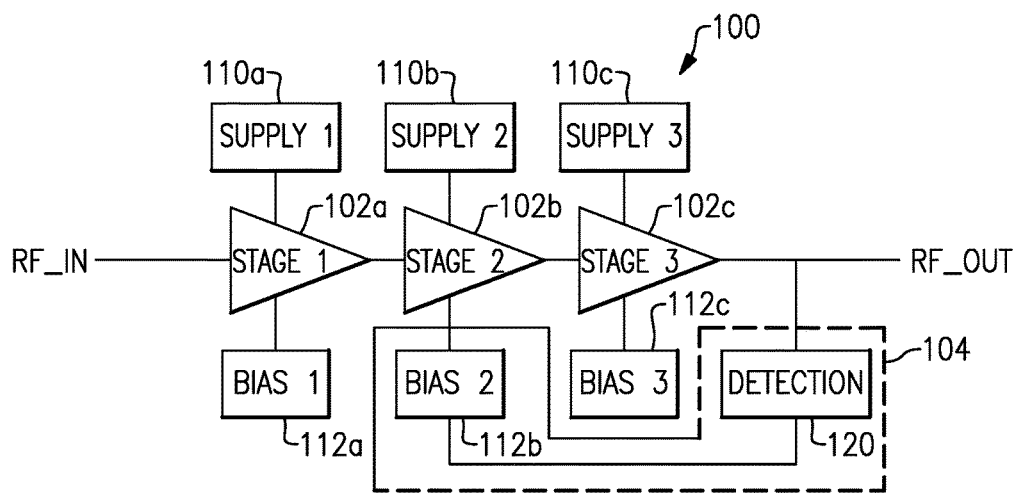

FIGS. 2A and 2B show examples of a PVL circuit 104 implemented for a PA system 100 having three amplification stages 102a-102c, according to one embodiment of the present disclosure. An input signal RF_IN is shown to be provided to an input of the first stage 102a, and an output of the first stage 102a is shown to be provided to an input of the second stage 102b. Similarly, an output of the second stage 102b is shown to be provided to an input of the third stage 102c. An output of the third stage 102c is shown to yield an output RF_OUT of the RF system 100. Each of the three stages is shown to be coupled to a DC supply circuit (110a, 110b or 110c) and a bias circuit (112a, 112b or 112c).

In the example of FIG. 2A, the PVL circuit 104 can include a detection circuit 120 that couples the output of the last stage (102c) (e.g., the third stage in the three-stage example) with the bias circuit (112c) for the same stage. In the example of FIG. 2B, the PVL circuit 104 can include a detection circuit 120 that couples the output of the last stage (102c) (e.g., the third stage in the three-stage example) with the bias circuit (112b) for another stage (e.g., stage 102b). Examples of the two configurations are described herein in greater detail. It will be understood that other configurations can also be implemented. It will also be understood that although various examples are described herein in the context of three-stage PA systems, one or more features of the present disclosure can also be implemented in PA systems having different numbers of stages.

Figure 3:
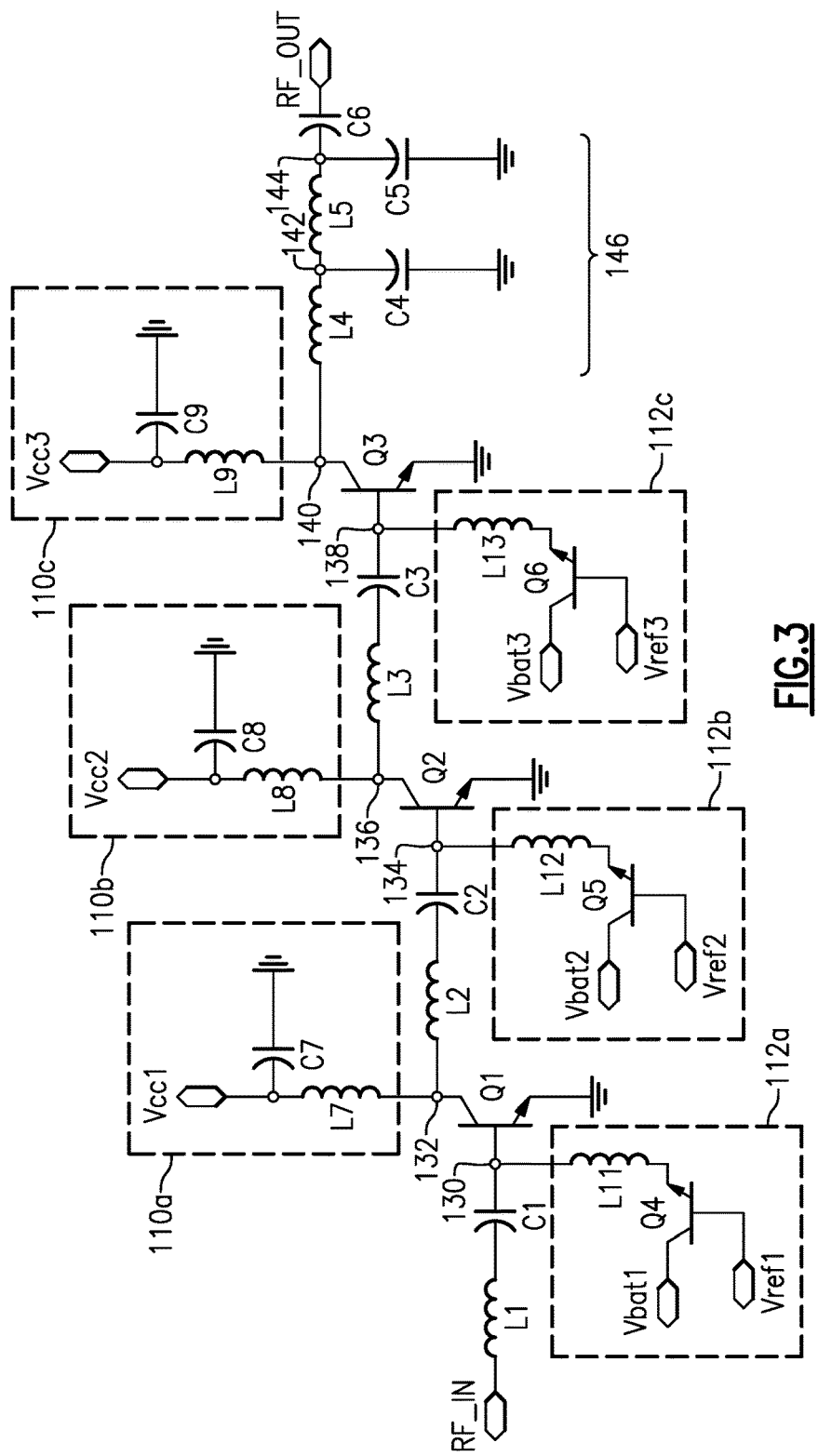
FIG. 3 shows an example of a PA system having three amplification stages, but without a ruggedness protection circuit, according to one embodiment of the present disclosure.

FIG. 3 shows an example of a PA system having three amplification stages, but without a ruggedness protection circuit, according to one embodiment of the present disclosure. The three amplification stages are shown to be provided by amplifying transistors Q1, Q2 and Q3 (e.g., NPN bipolar junction transistors (BJTs)). More particularly, an input RF signal (RF_IN) is shown to be provided to the base of Q1 through a matching network which can include, for example, L1 and C1 in series. The output of Q1 is shown to be provided through the collector, to the base of Q2 through a matching network which can include, for example, L2 and C2 in series. Similarly, the output of Q2 is shown to be provided through the collector, to the base of Q3 through a matching network which can include, for example, L3 and C3 in series. The output of Q3 is shown to be provided through the collector, to the PA output (as RF_OUT) through an output matching network 146. Such an output matching network can include, for example, L4, L5 and C6 in series, and C4 and C5 coupling respective nodes 142, 144 to ground.

In the example of FIG. 3, each of Q1, Q2 and Q3 is shown to be provided with a supply voltage through the collector. More particularly, the collector node 132 of Q1 is shown to receive a supply voltage Vcc1 through a line element such as a choke inductance L7. The input node for the supply voltage Vcc1 is shown to be coupled to ground through C7. For the purpose of description, such a circuit for providing Vcc1 to the collector node 132 can be identified as 110a. Similarly, the collector node 136 of Q2 is shown to receive a supply voltage Vcc2 through a line element such as a choke inductance L8. The input node for the supply voltage Vcc2 is shown to be coupled to ground through C8. For the purpose of description, such a circuit for providing Vcc2 to the collector node 136 can be identified as 110b. Similarly, the collector node 140 of Q3 is shown to receive a supply voltage Vcc3 through a line element such as a choke inductance L9. The input node for the supply voltage Vcc3 is shown to be coupled to ground through C9. For the purpose of description, such a circuit for providing Vcc3 to the collector node 140 can be identified as 110c. It will be understood that the supply voltage circuits 110a-110c are examples, and that supply voltages can be provided to the amplification transistors in other configurations.

In the example of FIG. 3, each of Q1, Q2 and Q3 is shown to be provided with a base voltage at the base in an emitter-follower configuration. More particularly, the base node 130 of Q1 is shown to receive a bias signal from a bias circuit 112a so as to yield a base voltage Vbb1. The bias circuit 112a is shown to include Q4, with a reference voltage Vref1 being input into the base and the output of Q4 being provided through the emitter, and with Vbat1 supply voltage being provided to the collector. The output of Q4 is shown to be coupled to the base node 130 through a line element such as an inductance L11. Similarly, the base node 134 of Q2 is shown to receive a bias signal from a bias circuit 112b so as to yield a base voltage Vbb2. The bias circuit 112b is shown to include Q5, with a reference voltage Vref2 being input into the base and the output of Q5 being provided through the emitter, and with Vbat2 supply voltage being provided to the collector. The output of Q5 is shown to be coupled to the base node 134 through a line element such as an inductance L12. Similarly, the base node 138 of Q3 is shown to receive a bias signal from a bias circuit 112c so as to yield a base voltage Vbb3. The bias circuit 112c is shown to include Q6, with a reference voltage Vref3 being input into the base and the output of Q6 being provided through the emitter, and with Vbat3 supply voltage being provided to the collector. The output of Q6 is shown to be coupled to the base node 138 through a line element such as an inductance L13. In the example of FIG. 3, each of the inductances L11, L12, L13 can be configured to provide, for example, isolating functionality to isolate the corresponding bias circuit from the RF signal passing through the corresponding stage of amplification.

Figure 4:
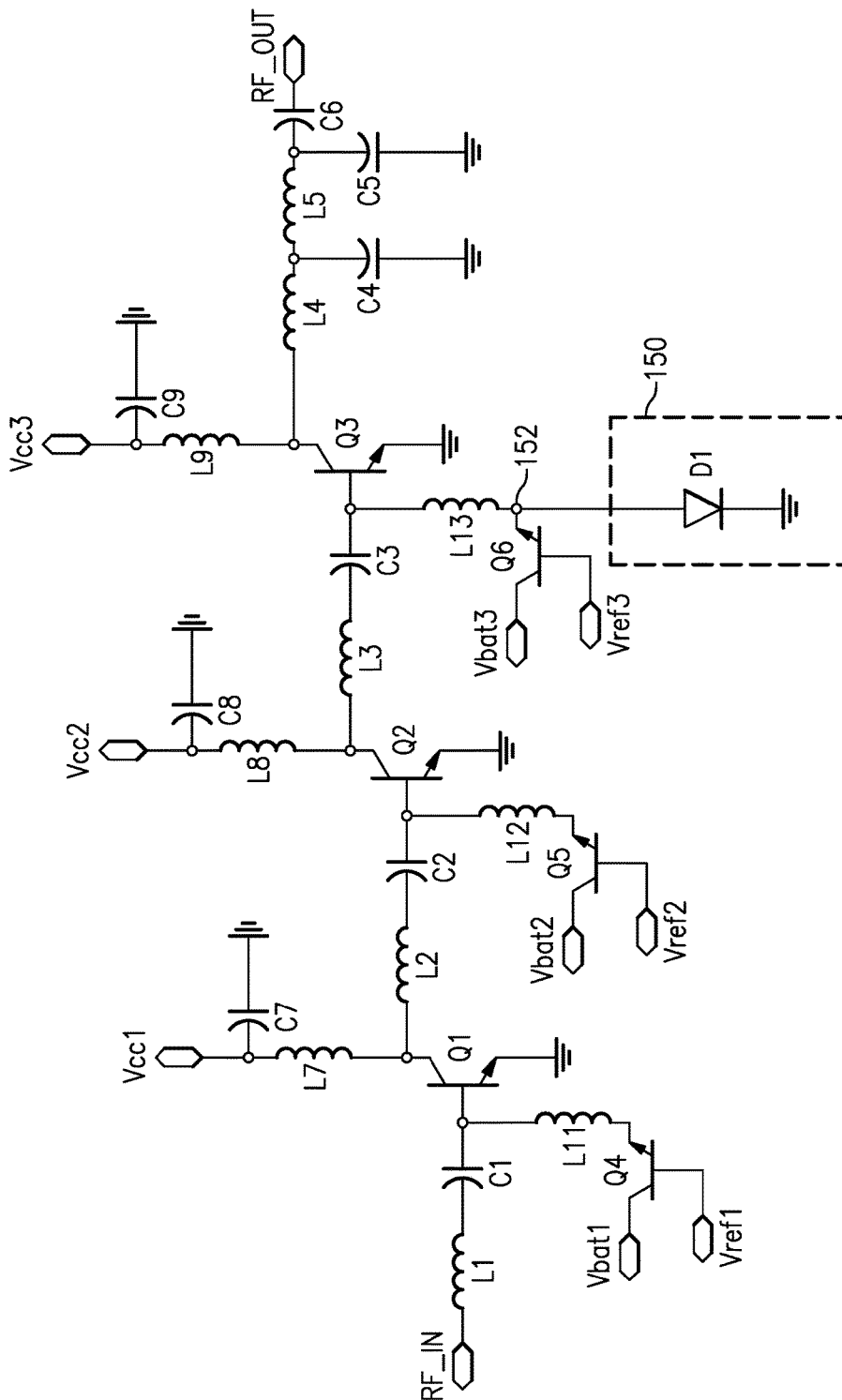
FIG. 4 shows an example of a ruggedness protection circuit implemented in the context of the example PA system of FIG. 3, according to one embodiment of the present disclosure.

FIG. 4 shows an example of a ruggedness protection circuit 150 implemented in the context of the example PA system of FIG. 3, according to one embodiment of the present disclosure. The ruggedness protection circuit 150 is shown to include a diode D1 that couples node 152 to ground. The node 152 is coupled to the base node 138 of Q3, and accordingly, the diode coupling to ground can provide current sink functionality in which the diode D1 starts to conduct current away from the base to thereby prevent the current participating in or having a multiplicative avalanche effect within Q3 when the collector node of Q3 experiences a high voltage such as a peak voltage excursion event in Q3. It is noted, however, that such a ruggedness protection circuit typically leads to a trade-off with normal operating performance parameters such as power-added efficiency (PAE) and/or error vector magnitude (EVM).

In some implementations, the present disclosure relates to a peak voltage limiting (PVL) circuit that can provide effective ruggedness protection functionality while having little or no effect on normal operating performance. As described herein, such a PVL circuit can be configured to detect a condition where a peak voltage at a collector of an amplifying transistor (e.g., of an output stage) exceeds some selected value. When such a condition is detected, the PVL circuit can reduce the base voltage Vbb of an amplifying transistor by activating a sink for the base current. As described herein, such an amplifying transistor for which Vbb is reduced may or may not be the same amplifying transistor at which the exceeding peak voltage condition is detected. For example, in the context of a 3-stage configuration, the exceeding peak voltage condition can be detected at the collector of the last stage (stage 3), and the stage for which Vbb is reduced in response can be stage 3 or another stage such as stage 2.

Figure 5:
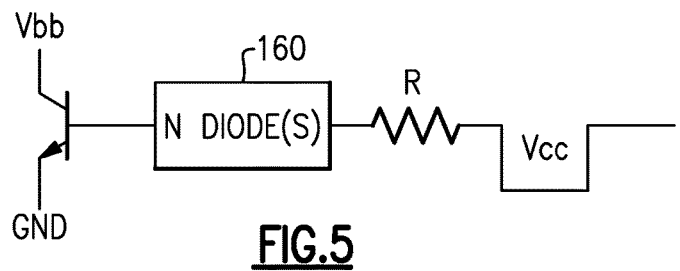
FIG. 5 shows that in some embodiments, a PVL circuit can include a group of one or more diodes arranged in series that couples a collector of the amplifying transistor to a transistor that can be activated to provide sinking of base current of the amplifying transistor.

FIG. 5 shows that in some embodiments, the foregoing PVL circuit can include a group of one or more diodes arranged in series (indicated as 160) that couples a collector of the amplifying transistor (for which exceeding peak voltage condition is being detected) to a transistor that can be activated to provide sinking of base current of the amplifying transistor (for which Vbb is being reduced). Such a reduction in Vbb results in reduction of gain and drive power capability of the amplifying transistor, to thereby reduce the peak voltage at the collector as a result of a smaller RF signal on that node.

In FIG. 5, the peak voltage being detected is indicated as Vcc, and the transistor for sinking of the base current (sometimes referred as a sinking transistor) is shown to have its base coupled to the output of the group of N diode(s) 160 (where N is a positive integer). The sinking transistor is shown to have its collector coupled to a node representative of the base voltage (Vbb) being reduced, and its emitter coupled to ground.

In FIG. 5, a resistance R is shown to be provided in series with the group of N diode(s) 160. In some embodiments, one or more circuit elements such as an inductance can replace the resistance R, or be implemented with the resistance R. In some embodiments, the number of diodes (N), R, and/or other circuit element(s) can be selected to, for example, set the selected voltage to facilitate the foregoing Vbb-reduction functionality. In some embodiments, such a selected voltage can be based on, for example, a conduction onset voltage associated with the group of N diode(s) 160. Such a conduction onset voltage can be based on degree and exponential rise in current conducted through the diode(s) as voltage builds on the collector node. In some embodiments, such an exponential nature of the diode curve can be utilized to provide a clamping effect on the voltage that manifests on the collector node, using a negative feedback loop back to transistor bias condition(s) on one or more amplification stages.

Figure 6:
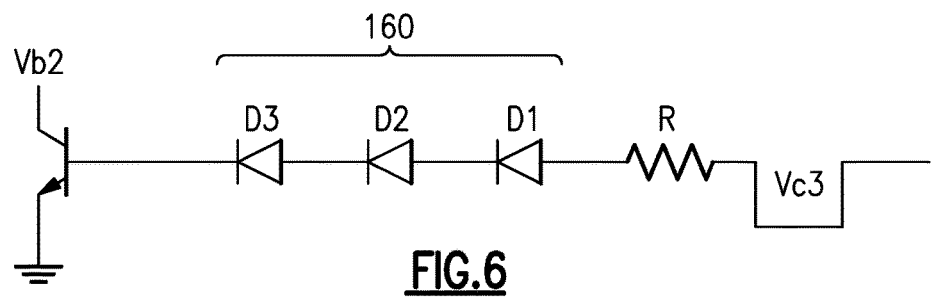
FIG. 6 shows a more specific example of the peak voltage detection configuration of FIG. 5, where peak voltage is detected at the collector of the last stage and such voltage is routed to a sinking transistor, according to one embodiment of the present disclosure.
Figure 7:
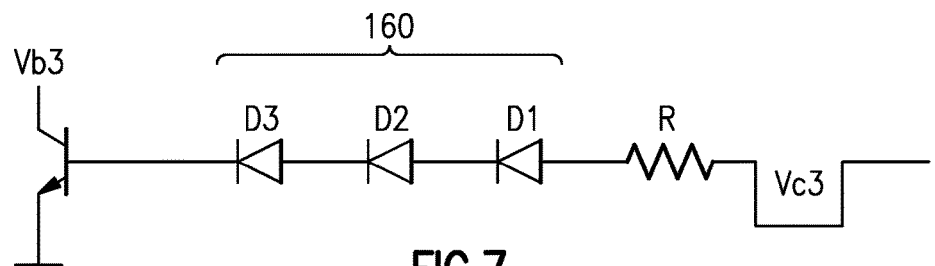
FIG. 7 shows another more specific example of the peak voltage detection configuration of FIG. 5, where peak voltage is detected at the collector of the last stage and such voltage is routed to a sinking transistor so as to reduce the base voltage of the same third stage, according to one embodiment of the present disclosure.

As described herein, an amplifying transistor for which Vbb is reduced may or may not be the same amplifying transistor at which peak voltage condition is being detected. FIG. 6 shows a more specific example of the peak voltage detection configuration of FIG. 5, where peak voltage (Vc3) is detected at the collector of the last stage (in a 3-stage example) and such voltage is routed to a sinking transistor (when the diodes 160 are turned ON) so as to reduce the base voltage Vb2 of the second stage, according to one embodiment of the present disclosure. FIG. 7 shows another more specific example of the peak voltage detection configuration of FIG. 5, where peak voltage (Vc3) is detected at the collector of the last stage (in a 3-stage example) and such voltage is routed to a sinking transistor (when the diodes 160 are turned ON) so as to reduce the base voltage Vb3 of the same third stage, according to one embodiment of the present disclosure. Examples of both of the configurations of FIGS. 6 and 7 are described herein in greater detail.

FIGS. 8-11 show examples where PVL circuits 104 are implemented in different manners in an example 3-stage PA system described herein in reference to FIG. 3, according to various embodiments of the present disclosure. Accordingly, details concerning the three stages and their respective supply circuits and bias circuits can be found herein in reference to FIG. 3.

Figure 8:
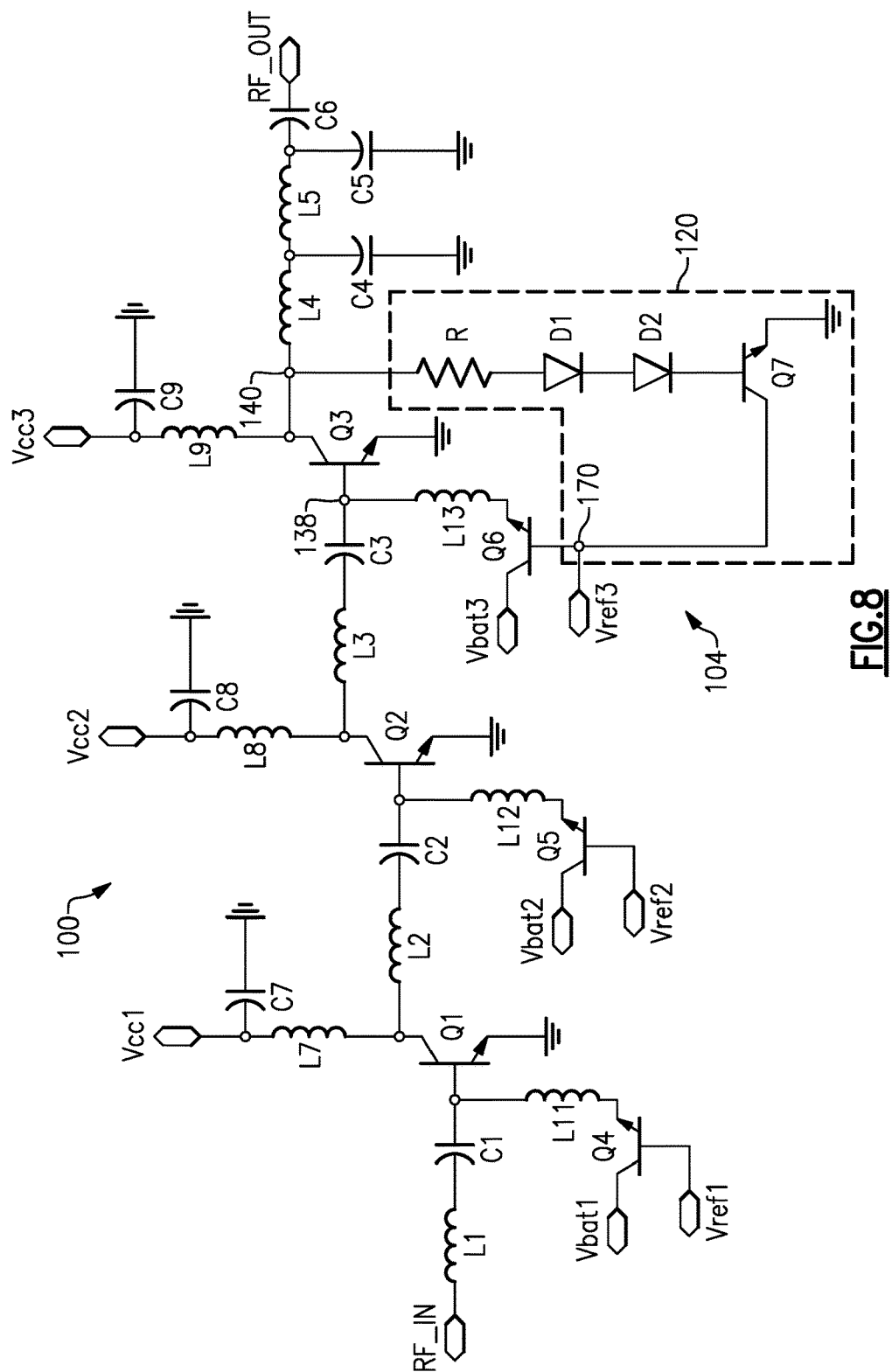
FIGS. 8-11 show examples where PVL circuits are implemented in different manners in an example 3-stage PA system, according to various embodiments of the present disclosure.
Figure 9:
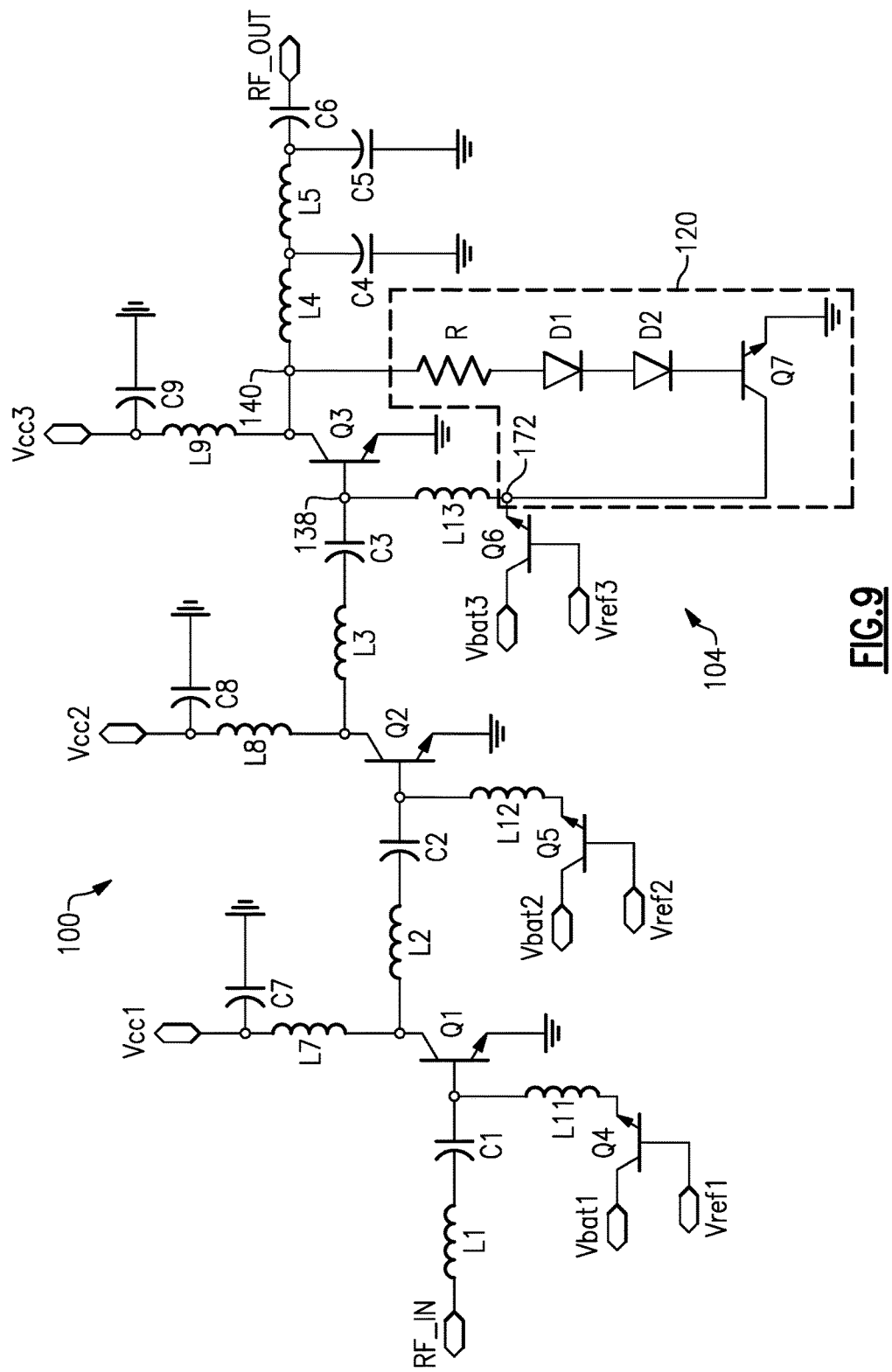

In each example of FIGS. 8 and 9, a PVL circuit 104 includes a detection circuit 120 that couples the collector node 140 of the third stage amplifier Q3 to the bias circuit for the same third stage amplifier Q3. In each example of FIGS. 10 and 11, a PVL circuit 104 includes a detection circuit 120 that couples the collector node 140 of the third stage amplifier Q3 to the bias circuit for the second stage amplifier Q2.

In each of the four examples of FIGS. 8-11, the detection circuit 120 includes a series circuit having a resistance R and a group of diodes (depicted as D1 and D2), and a sinking transistor Q7. More particularly, the series circuit (R, D1 and D2) is shown to couple the collector node (140) and the base of the sinking transistor Q7. The emitter of Q7 is grounded, and the collector of Q7 is coupled to the respective bias circuit. It will be understood that the detection circuit 120 can include more or less number of diodes. It will also be understood that the resistance R can be replaced with or be supplemented with one or more circuit elements such an inductance.

In the example of FIG. 8, the detection circuit 120 is shown to couple the collector node 140 of the third stage amplifier Q3 to the bias circuit of the same third stage amplifier Q3. More particularly, the collector of the sinking transistor Q7 is shown to be coupled to the reference voltage (Vref3) node 170 of the emitter-follower bias circuit for the third stage amplifier Q3. Accordingly, when the sinking transistor Q7 is turned ON through the diodes D1, D2 by a peak voltage condition, current can be diverted from the reference voltage (Vref3) node 170 to ground through Q7, thereby reducing the voltage (Vb3) provided to the base node 138 of the third stage amplifier Q3.

In the example of FIG. 9, the detection circuit 120 is shown to couple the collector node 140 of the third stage amplifier Q3 to the bias circuit of the same third stage amplifier Q3. More particularly, the collector of the sinking transistor Q7 is shown to be coupled to the emitter node 172 of Q6 of the emitter-follower bias circuit for the third stage amplifier Q3. Accordingly, when the sinking transistor Q7 is turned ON through the diodes D1, D2 by a peak voltage condition, current can be diverted from the emitter node 172 to ground through Q7, thereby reducing the voltage (Vb3) provided to the base node 138 of the third stage amplifier Q3.

Figure 10:
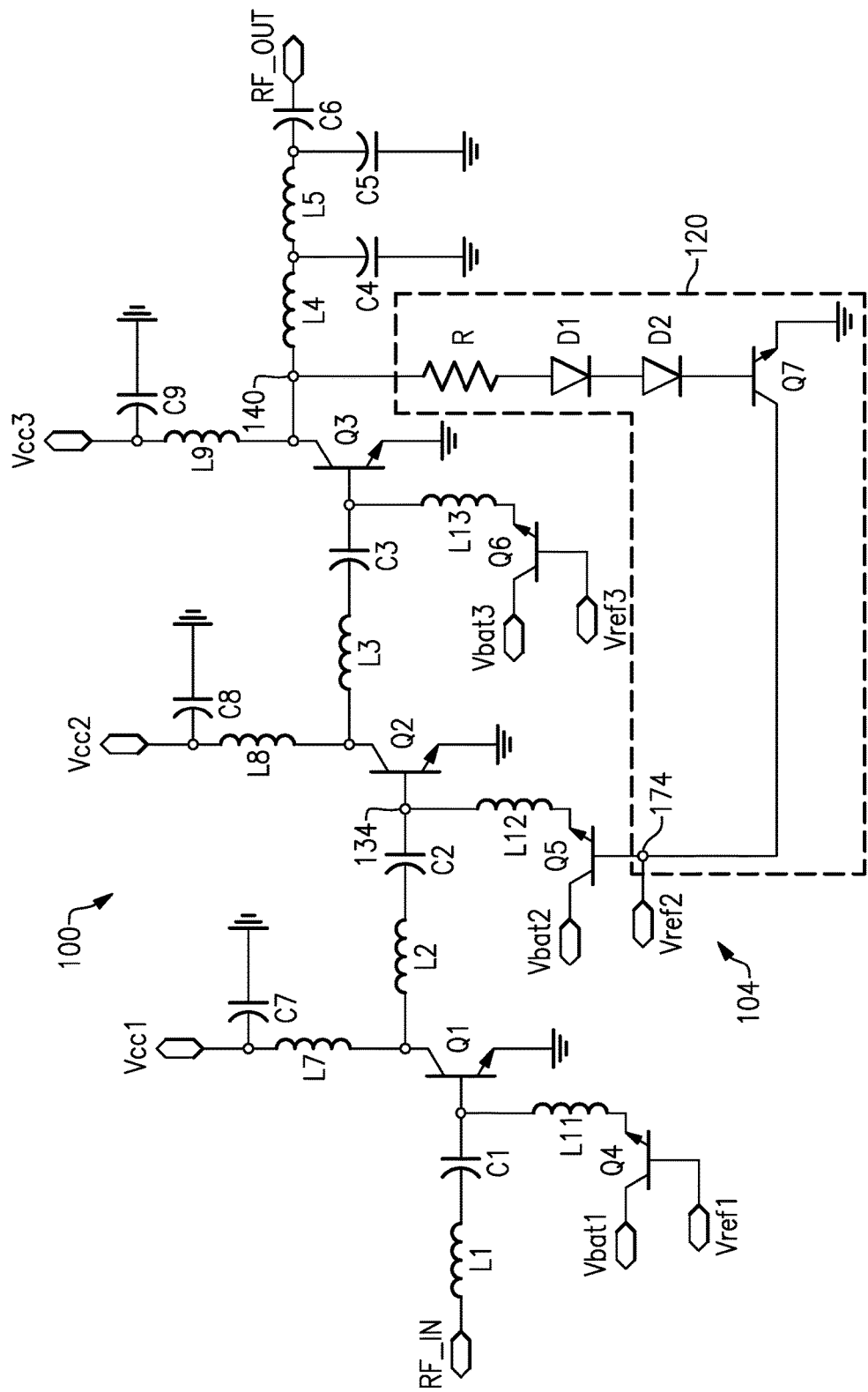

In the example of FIG. 10, the detection circuit 120 is shown to couple the collector node 140 of the third stage amplifier Q3 to the bias circuit of the second stage amplifier Q2. More particularly, the collector of the sinking transistor Q7 is shown to be coupled to the reference voltage (Vref2) node 174 of the emitter-follower bias circuit for the second stage amplifier Q2. Accordingly, when the sinking transistor Q7 is turned ON through the diodes D1, D2 by a peak voltage condition, current can be diverted from the reference voltage (Vref2) node 174 to ground through Q7, thereby reducing the voltage (Vb2) provided to the base node 134 of the second stage amplifier Q2.

Figure 11:
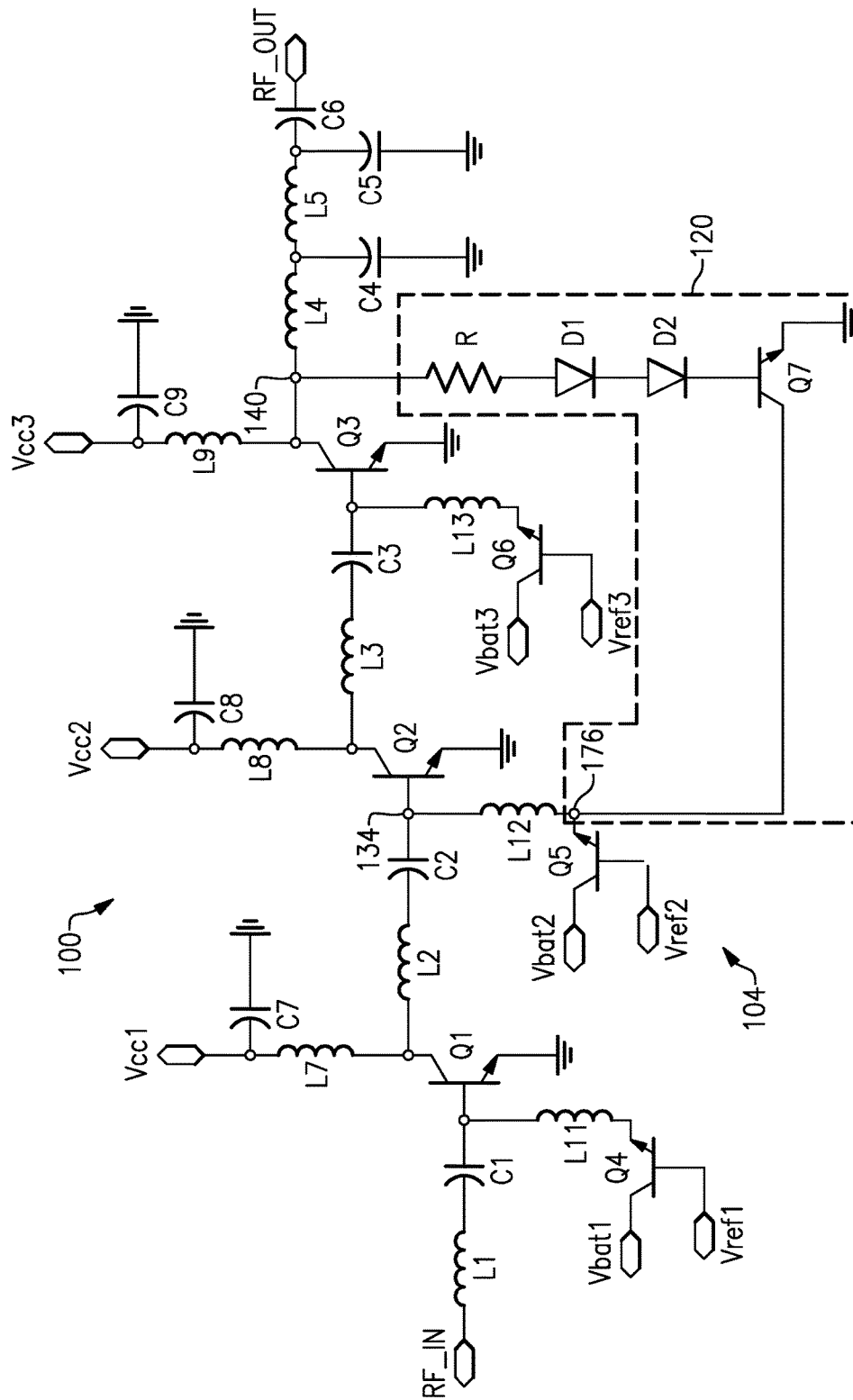

In the example of FIG. 11, the detection circuit 120 is shown to couple the collector node 140 of the third stage amplifier Q3 to the bias circuit of the second stage amplifier Q2. More particularly, the collector of the sinking transistor Q7 is shown to be coupled to the emitter node 176 of Q5 of the emitter-follower bias circuit for the second stage amplifier Q2. Accordingly, when the sinking transistor Q7 is turned ON through the diodes D1, D2 by a peak voltage condition, current can be diverted from the emitter node 176 to ground through Q7, thereby reducing the voltage (Vb2) provided to the base node 134 of the second stage amplifier Q2.

Figure 12:
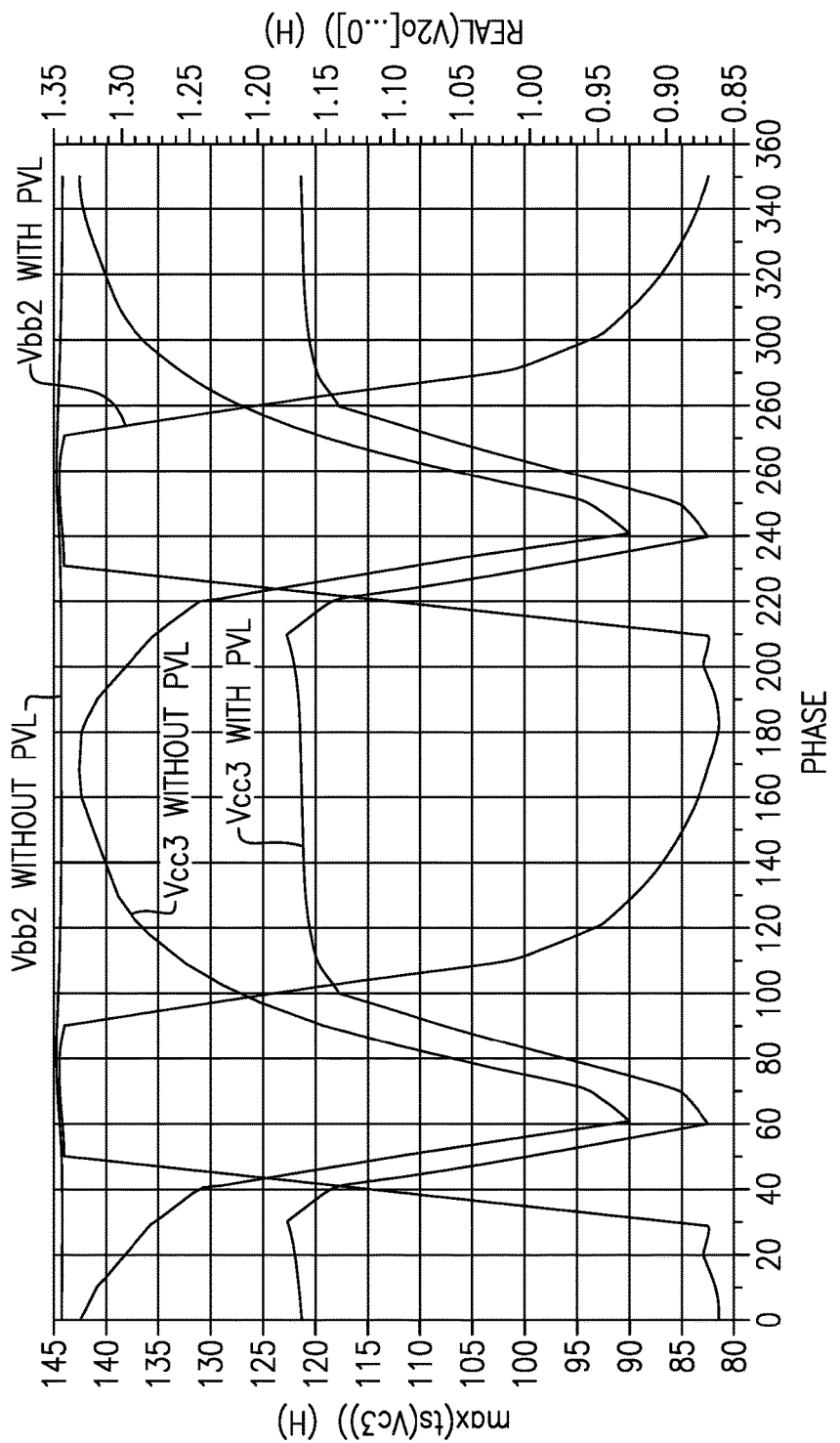
FIG. 12 shows an example of how a collector voltage Vcc3 can be advantageously limited by a PVL circuit having one or more features as described herein, according to one embodiment of the present disclosure.

FIG. 12 shows an example of how a collector voltage Vcc3 can be advantageously limited by a PVL circuit having one or more features as described herein, according to one embodiment of the present disclosure. In FIG. 12, Vcc3 (with a vertical axis scale on the left) curves (with and without PVL functionality) are plotted as a function of phase. Also plotted are Vbb2 curves (with a vertical axis scale on the right) for the configurations with and without PVL functionality.

In the example of FIG. 12, Vbb2 remains approximately constant without the PVL functionality. Accordingly, Vcc3 is shown to reach relatively high peak values above 14 volts, thereby increasing the likelihood of breakdown.

With the PVL functionality, Vbb2 is shown to decrease when Vcc3 exceeds some selected value (e.g., about 12 volts). With such a decrease in Vbb2, Vcc3 is shown to be limited to a level slightly above the selected value. Accordingly, the limited Vcc3 level can decrease the likelihood of breakdown. It is further noted that when Vcc3 decreases below the selected value, Vbb2 is allowed to increase to its original level, thereby allowing normal operation.

In some embodiments, one or more features of the present disclosure can be utilized to limit the collector current instead of the collector voltage (e.g., Vcc3). However, as shown in the example of FIG. 12, the phase of Vcc3 with PVL is the same as or close to the phase of Vcc3 associated with normal operation. Accordingly, limiting the collector voltage can be preferable in many RF applications.

A PVL circuit having one or more features as described herein can be utilized as an effective ruggedness protection circuit. In some embodiments, such a desirable functionality can be realized without significantly degrading other performance parameters associated with a PA.

Figure 13A:
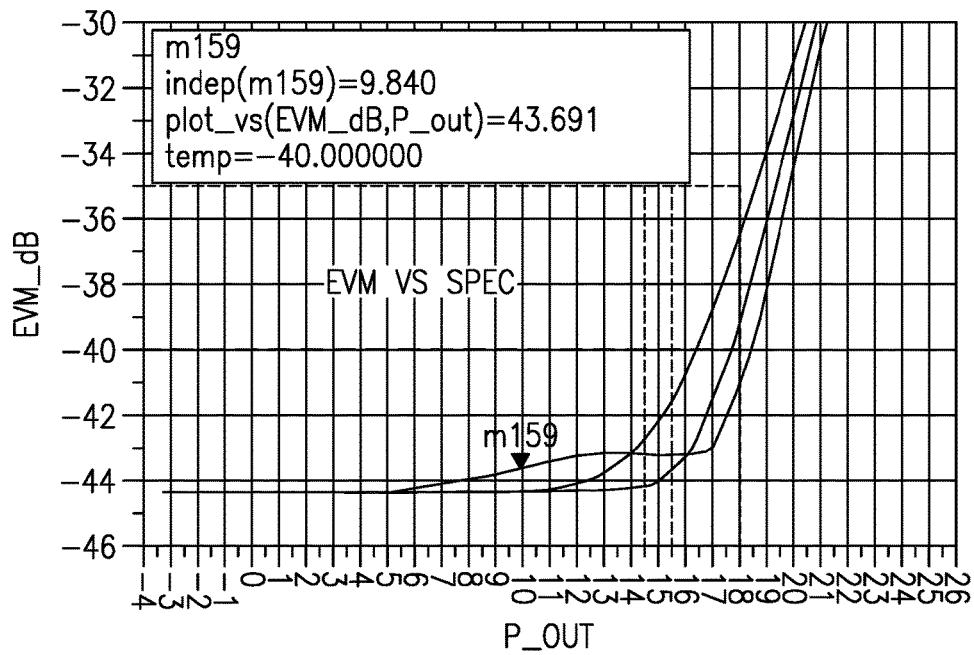
FIG. 13A shows EVM performance plots without a PVL circuit, according to one embodiment.
Figure 13B:
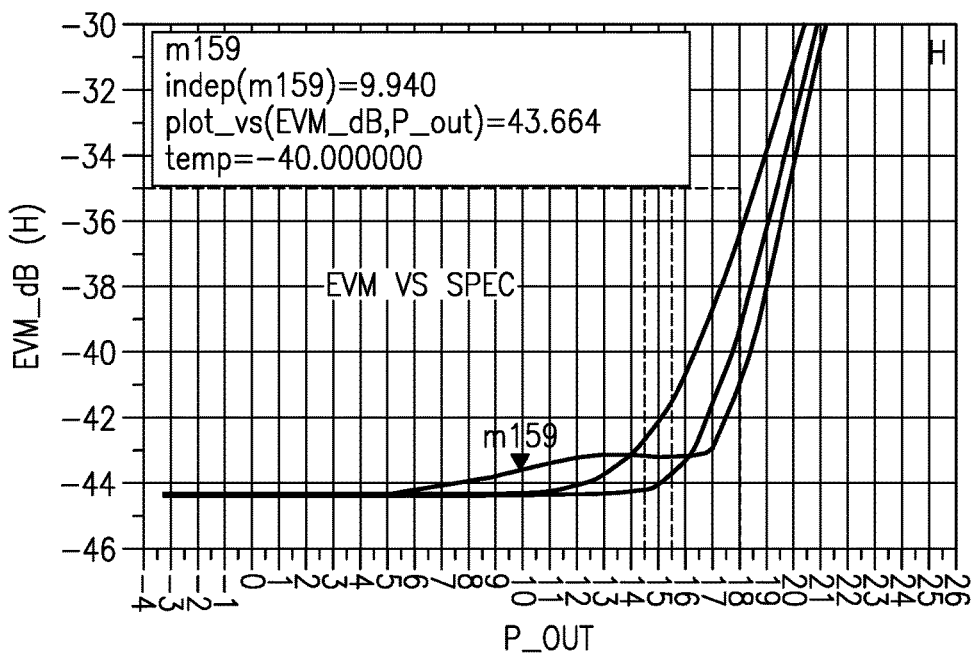
FIG. 13B shows EVM performance plots with a PVL circuit, according to one embodiment.

For example, FIGS. 13 and 14 show examples of performance with and without a PVL circuit. More particularly, FIG. 13A shows EVM performance plots without a PVL circuit, according to one embodiment of the present disclosure, and FIG. 13B shows EVM performance plots with a PVL circuit, according to one embodiment of the present disclosure. One can see that EVM performance is generally not degraded by the presence of the PVL circuit.

Figure 14A:
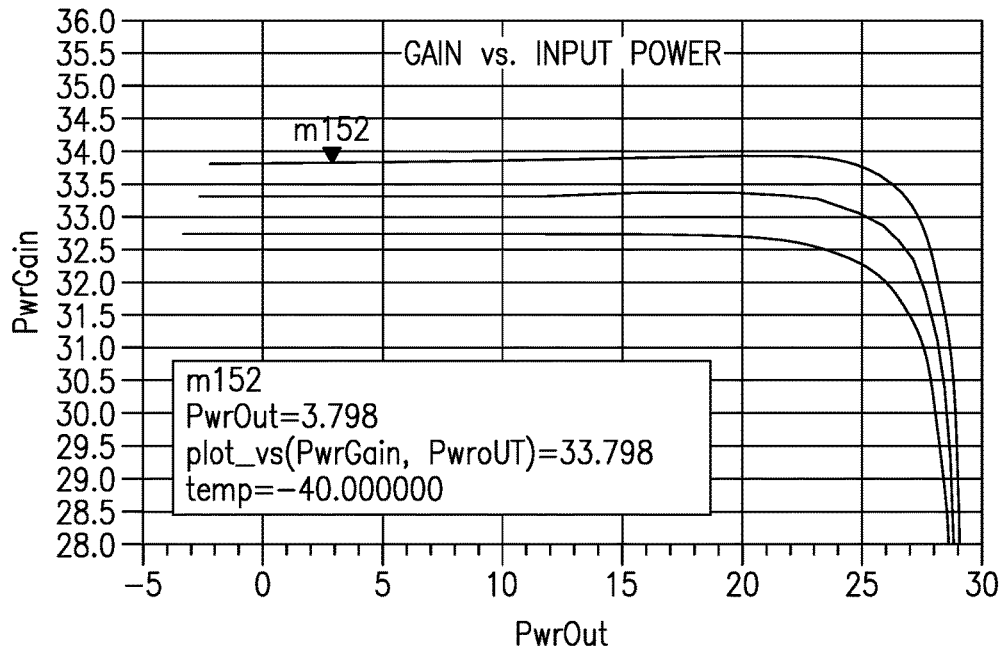
FIG. 14A shows gain profiles without a PVL circuit, according to one embodiment of the present disclosure.
Figure 14B:
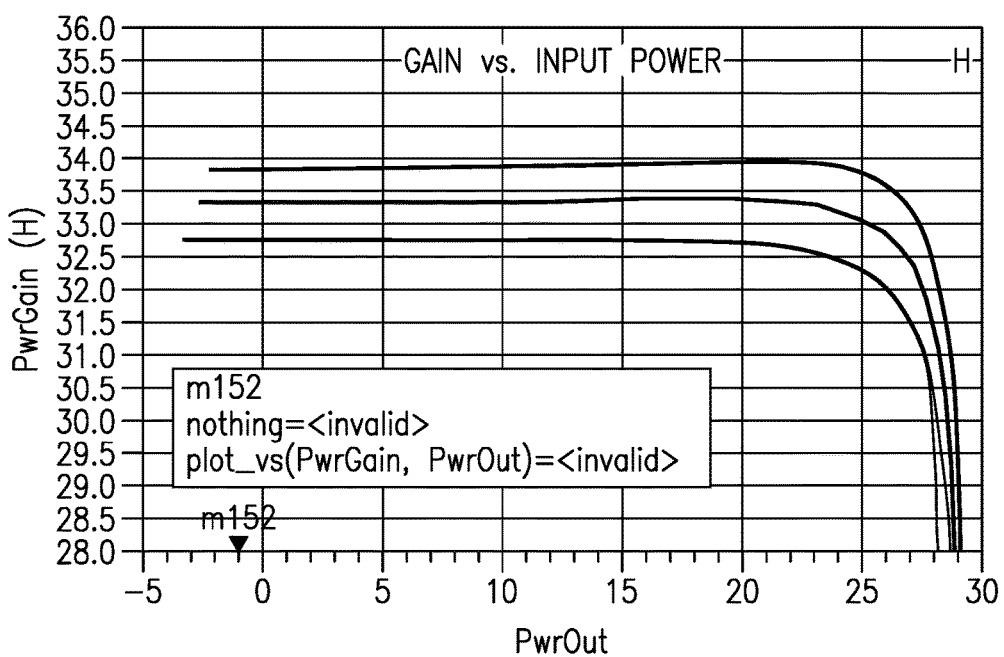
FIG. 14B shows gain profiles with a PVL circuit, according to one embodiment of the present disclosure.

Similarly, FIG. 14A shows gain profiles without a PVL circuit, according to one embodiment of the present disclosure, and FIG. 14B shows gain profiles with a PVL circuit, according to one embodiment of the present disclosure. One can see that gain performance is generally not degraded by the presence of the PVL circuit.

In some embodiments, a PA having a PVL circuit as described herein can provide a number of advantageous features. Such features can include, for example, a smaller circuit while providing effective ruggedness protection, little or no hysteresis effect associated with operation of the PVL circuit, relatively quick response to high voltage excursions at collectors, and little or no degradation of the PA's normal operating characteristics.

In some embodiments, a PVL circuit as described herein can be implemented as a closed loop feedback system. Such a PVL circuit can be implemented in PAs that utilize different process technologies. For example, one or more features of the present disclosure can be implemented for NPN type amplifying transistors that are based on different process technologies as described herein.

Figure 15:
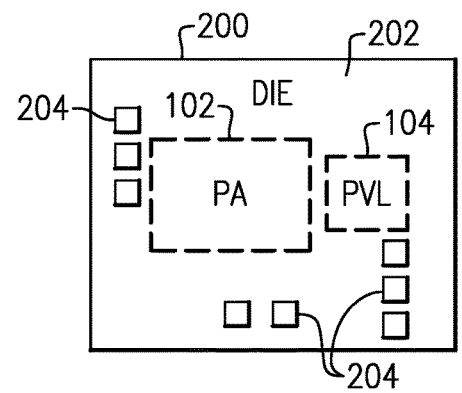
FIG. 15 depicts a die 200 that can include a PVL circuit 104 having one or more features as described herein, according to one embodiment of the present disclosure.

FIG. 15 depicts a die 200 that can include a PVL circuit 104 having one or more features as described herein, according to one embodiment of the present disclosure. The semiconductor die 200 can include a substrate 202. In some embodiments, a power amplifier (PA) circuit 102 (e.g., SiGe or GaAs devices) can also be implemented on the substrate 202. A plurality of connection pads 204 can also be formed on the substrate 202 to provide, for example, power and signals for the PA circuit 102.

Figure 16:
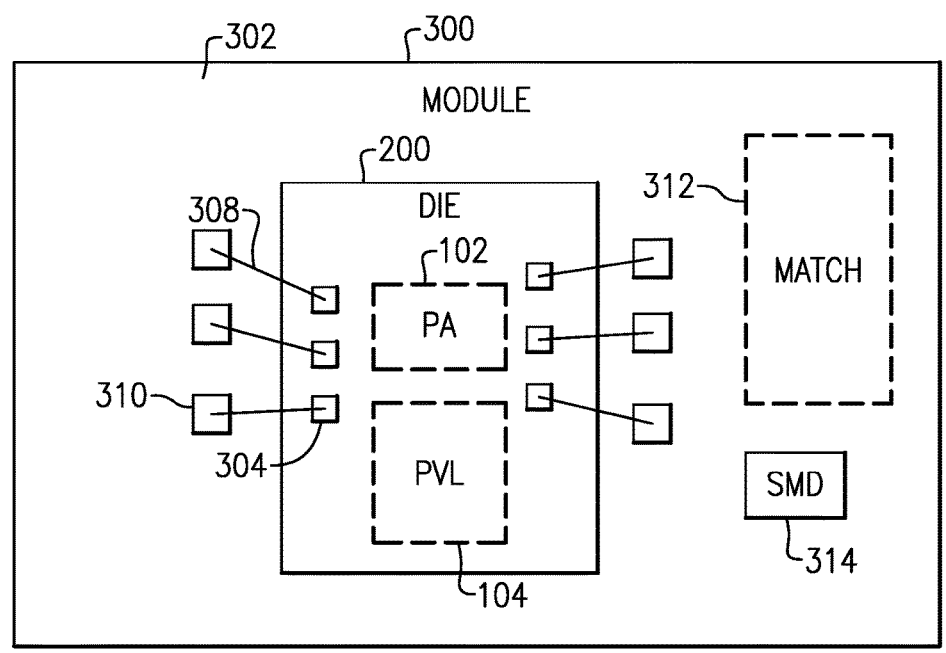
FIG. 16 schematically depicts an example module having a packaging substrate that is configured to receive a plurality of components, according to one embodiment of the present disclosure.

In some implementations, one or more features described herein can be included in a module. FIG. 16 schematically depicts an example module 300 having a packaging substrate 302 that is configured to receive a plurality of components, according to one embodiment of the present disclosure. In some embodiments, such components can include a die 200 having one or more featured as described herein. For example, the die 200 can include a PA circuit 102 and a PVL circuit 104. A plurality of connection pads 304 can facilitate electrical connections such as wirebonds 308 to connection pads 310 on the substrate 302 to facilitate passing of various power and signals to and from the die 200.

In some embodiments, other components can be mounted on or formed on the packaging substrate 302. For example, one or more surface mount devices (SMDs) (314) and one or more matching networks (322) can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 17:
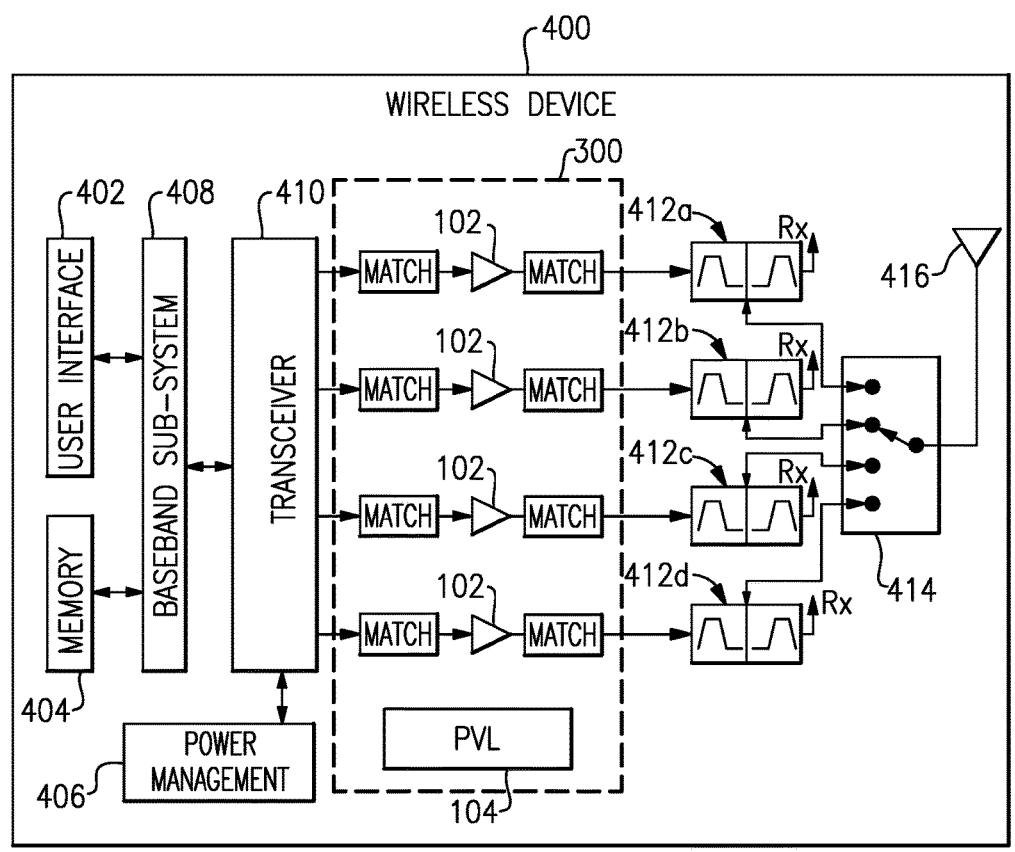
FIG. 17 schematically depicts an example wireless device 400 having one or more advantageous features described herein, according to one embodiment of the present disclosure.

FIG. 17 schematically depicts an example wireless device 400 having one or more advantageous features described herein, according to one embodiment of the present disclosure. One or more PAs 102 as described herein are can be can utilize one or more PVL circuits 104 as described herein. In embodiments where the PAs 102 and their PVL circuit(s) 104 are packaged into a module, such a module can be represented by a dashed box 300. In some embodiments, the module 300 can include at least some of input and output matching circuits.

The PAs 102 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 102 are shown to be matched and routed to an antenna 416 via their respective duplexers 412a-412d and a band-selection switch 414. The band-selection switch 414 can be configured to allow selection of, for example, an operating band or an operating mode. In some embodiments, each duplexer 412 can allow transmit and receive operations to be performed simultaneously using a common antenna (e.g., 416). In FIG. 17, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage limiting circuit for a power amplifier (PA), comprising:
    a diode circuit coupled to an output of an amplification stage, the diode circuit configured to provide a conductive path from the output when an output voltage exceeds a selected value and the amplification stage being an output stage of an amplification path having a plurality of stages; and
    a sink circuit coupled to the diode circuit and a bias circuit of the amplification stage, the sink circuit configured to reduce a bias voltage provided to the amplification stage by the bias circuit when the output voltage exceeds the selected value to thereby limit the output voltage, by diverting at least some of a current from a reference voltage node or an emitter node of the bias circuit.

2. The voltage limiting circuit of claim 1 wherein the amplification stage includes an amplifying transistor having a base, a collector, and an emitter, such that the output of the amplification stage is at the collector of the amplifying transistor.

3. The voltage limiting circuit of claim 2 wherein the bias circuit is configured to provide the bias voltage to the base of the amplifying transistor.

4. The voltage limiting circuit of claim 2 wherein the bias circuit is configured to provide the bias voltage to a base of another amplifying transistor associated with a different amplification stage.

5. The voltage limiting circuit of claim 4 wherein the different amplification stage is a driver stage.

6. The voltage limiting circuit of claim 4 wherein the different amplification stage is an amplification stage immediately preceding the output stage.

7. The voltage limiting circuit of claim 2 wherein the diode circuit includes N diodes connected in series, the quantity N being a positive integer.

8. The voltage limiting circuit of claim 7 wherein the quantity N is selected to obtain the selected value of the output voltage.

9. The voltage limiting circuit of claim 7 wherein the diode circuit further includes a resistance in series with the N diodes.

10. The voltage limiting circuit of claim 7 wherein the sink circuit includes a sink transistor having a base coupled to an end of the N diodes such that when the N diodes become conductive, the sink transistor is turned ON.

11. The voltage limiting circuit of claim 10 wherein an emitter of the sink transistor is coupled to ground, and a collector of the sink transistor is coupled to a node associated with a reference voltage provided by the bias circuit, such that when the sink transistor is ON, at least some of the reference voltage is diverted to the ground through the sink transistor.

12. The voltage limiting circuit of claim 11 wherein the bias circuit includes an emitter follower transistor having a base, a collector, and an emitter, such that the reference voltage is provided to the base of the emitter follower transistor, and a supply voltage is provided to the collector.

13. The voltage limiting circuit of claim 12 wherein the collector of the sink transistor is coupled to the base of the emitter follower transistor to thereby divide the reference voltage before it enters the emitter follower transistor.

14. The voltage limiting circuit of claim 12 wherein the collector of the sink transistor is coupled to the emitter of the emitter follower transistor to thereby divide a base current at the amplifying transistor, provided by the emitter follower transistor.

15. The voltage limiting circuit of claim 2 wherein the amplifying transistor includes a bipolar junction transistor (BJT).

16. The voltage limiting circuit of claim 15 wherein the bipolar junction transistor is configured as an NPN transistor.

17. The voltage limiting circuit of claim 15 wherein the bipolar junction transistor is a SiGe transistor or a GaAs transistor.

18. A method for operating a power amplifier (PA), the method comprising:
  detecting a condition where an output voltage of an amplification stage exceeds a selected value, the amplification stage being an output stage of an amplification path having a plurality of stages;
  providing a conductive path from an output of the amplification stage upon detection of the condition; and
  activating a sink circuit coupled to the conductive path to reduce a bias voltage provided by a bias circuit of the amplification stage, to the amplification stage, by diverting at least some of a current from a reference voltage node or an emitter node of the bias circuit.

19. A power amplifier (PA) comprising:
  an input port configured to receive an input radio-frequency (RF) signal and an output port configured to yield an amplified radio-frequency signal;
  a plurality of amplification stages implemented between the input port and the output port, each of the plurality of amplification stages configured to amplify the input radio-frequency signal to yield the amplified radio-frequency signal;
  a bias circuit for each of the plurality of amplification stages; and
  a ruggedness protection circuit including a diode circuit coupled to an output of an output stage of the plurality of amplification stages, the diode circuit configured to provide a conductive path from the output when an output voltage exceeds a selected value, the ruggedness protection circuit further including a sink circuit coupled to the diode circuit and a selected bias circuit of the output stage, the sink circuit configured to reduce a bias voltage provided by the selected bias circuit when the output voltage exceeds the selected value to thereby limit the output voltage, by diverting at least some of a current from a reference voltage node or an emitter node of the bias circuit.

* * * * *